United States Patent
Samani et al.

(10) Patent No.: US 10,797,193 B2
(45) Date of Patent: Oct. 6, 2020

(54) BIAS CONTROL STRUCTURE FOR AVALANCHE PHOTODIODES

(71) Applicant: Lumentum Operations LLC, Milpitas, CA (US)

(72) Inventors: Alireza Samani, Montreal (CA); David Plant, Westmount (CA); Michael Ayliffe, Ottawa (CA)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 16/253,475

(22) Filed: Jan. 22, 2019

(65) Prior Publication Data

US 2019/0229227 A1 Jul. 25, 2019

Related U.S. Application Data

(60) Provisional application No. 62/620,749, filed on Jan. 23, 2018.

(51) Int. Cl.
| | |
|---|---|
| *H01L 31/10* | (2006.01) |
| *H01L 31/02* | (2006.01) |
| *H01L 31/107* | (2006.01) |
| *H01L 31/028* | (2006.01) |
| *H01L 31/105* | (2006.01) |

(52) U.S. Cl.
CPC .......... *H01L 31/107* (2013.01); *H01L 31/028* (2013.01); *H01L 31/105* (2013.01)

(58) Field of Classification Search
CPC .... H01L 31/107; H01L 31/028; H01L 31/105
See application file for complete search history.

(56) References Cited

U.S. PATENT DOCUMENTS

| | | | | |
|---|---|---|---|---|
| 7,348,608 B2 * | 3/2008 | Ko | ...... | H01L 31/1075 |
| | | | | 257/185 |
| 8,637,875 B2 * | 1/2014 | Finkelstein | ......... | H01L 31/0336 |
| | | | | 257/184 |
| 8,778,725 B1 * | 7/2014 | Huang | ......... | H01L 31/107 |
| | | | | 438/48 |
| 9,070,815 B2 * | 6/2015 | Lee | ........ | H01L 31/105 |
| 9,478,689 B2 * | 10/2016 | Huang | ........ | H01L 31/1075 |
| 9,530,905 B2 * | 12/2016 | Wang | .......... | H01L 27/1443 |
| 10,147,829 B2 * | 12/2018 | Chen | ......... | H01L 31/02005 |
| 10,256,305 B2 * | 4/2019 | Choi | ........ | H01L 29/045 |
| 10,274,687 B1 * | 4/2019 | Shi | ........ | G02B 6/4246 |
| 10,446,700 B2 * | 10/2019 | Wang | ........ | H01L 31/028 |
| 10,468,543 B2 * | 11/2019 | Wang | ........ | H01L 31/02363 |
| 2004/0106265 A1 * | 6/2004 | Vickers | ......... | H01L 31/107 |
| | | | | 438/380 |
| 2011/0005570 A1 * | 1/2011 | Jain | ........ | B82Y 20/00 |
| | | | | 136/244 |
| 2014/0246596 A1 * | 9/2014 | Antonuk | ......... | G01T 1/208 |
| | | | | 250/369 |

(Continued)

*Primary Examiner* — Ida M Soward
(74) *Attorney, Agent, or Firm* — Harrity & Harrity, LLP

(57) ABSTRACT

According to some implementations, an avalanche photodiode may include a photon absorbing layer to absorb photons of an optical beam and to provide a response. The avalanche photodiode may include a gain response layer to provide a gain to the response. The avalanche photodiode may include a bias control structure connected to the gain response layer to control an electric field in the photon absorbing layer and the gain response layer.

20 Claims, 5 Drawing Sheets

(56) References Cited

U.S. PATENT DOCUMENTS

| | | | | |
|---|---|---|---|---|
| 2015/0372159 A1* | 12/2015 | Englund | ................... | G01J 3/18 |
| | | | | 356/328 |
| 2017/0012076 A1* | 1/2017 | Chen | ................. | H01L 27/14652 |
| 2017/0244022 A1* | 8/2017 | Kojima | ................ | A61B 8/4483 |
| 2019/0051765 A1* | 2/2019 | Cheng | ................... | H01L 31/105 |

\* cited by examiner

BIAS CONTROL STRUCTURE FOR AVALANCHE PHOTODIODES

RELATED APPLICATION(S)

This application claims priority under 35 U.S.C. § 119 to U.S. Provisional Patent Application No. 62/620,749, filed on Jan. 23, 2018, the content of which is incorporated by reference herein in its entirety.

TECHNICAL FIELD

The present disclosure relates to avalanche photodiodes. More particularly, some aspects of the present disclosure relate to a bias control structure for avalanche photodiodes.

BACKGROUND

An avalanche photodiode may be used in an optical communication system to perform a measurement of an optical signal. For example, an avalanche photodiode may use the photoelectric effect to generate electrons, and may perform avalanche multiplication to apply an internal gain to an optical signal. By applying the internal gain, the avalanche photodiode enables higher sensitivity and improved signal to noise ratio (SNR) relative to a P-I-N photodiode. As a result, avalanche photodiodes may be used to enable increasingly high-speed communications for optical communications systems where high sensitivity and high SNR is required.

An avalanche photodiode may include an absorption medium, a charge layer, and a multiplication region to apply the internal gain and use the photoelectric effect to perform a measurement of an optical signal. Silicon-germanium avalanche photodiodes may be used to form the absorption medium, the charge layer, and the multiplication region for telecommunications bandwidth-based applications.

SUMMARY

According to some implementations, an avalanche photodiode may include a photon absorbing layer to absorb photons of an optical beam and to provide a response. The avalanche photodiode may include a gain response layer to provide a gain to the response. The avalanche photodiode may include a bias control structure connected to the gain response layer to control an electric field in the photon absorbing layer and the gain response layer.

According to some implementations, a photodiode may include a substrate. The photodiode may include a buffer layer. The photodiode may include a silicon layer. The silicon layer may include a set of p-doped silicon sections. The set of p-doped silicon sections may include a first p-doped silicon section and a second p-doped silicon section. The silicon layer may include a set of intrinsic silicon sections sandwiching the set of p-doped silicon sections. The silicon layer may include a set of n-doped silicon sections sandwiching the set of intrinsic silicon sections. The photodiode may include a set of germanium layers. The set of germanium layers may include an intrinsic germanium layer disposed on the set of intrinsic silicon sections and the first p-doped silicon section. The set of germanium layers may include a p-doped germanium layer disposed on the intrinsic germanium layer. The photodiode may include a set of cathodes disposed on the set of n-doped silicon sections. The photodiode may include an anode disposed on the p-doped germanium layer. The photodiode may include a bias control structure disposed on the second p-doped silicon section.

According to some implementations, an optical detector may include an avalanche photodiode. The avalanche photodiode may include a first material to absorb photons of an optical beam and to provide a response. The avalanche photodiode may include a second material to provide a gain to the response. The avalanche photodiode may include a bias control structure connected to the first material to control a first electric field in the first material and a second electrical field in the second material. The optical detector may include a waveguide coupled to the avalanche photodiode to direct the optical beam to the first material.

DETAILED DESCRIPTION

The following detailed description of example implementations refers to the accompanying drawings. The same reference numbers in different drawings may identify the same or similar elements.

An avalanche photodiode may use silicon for a charge layer and a multiplication region as a result of silicon being transparent in an O-band and in a C-band, an L-band, and/or the like. Further, silicon may be selected as a result of silicon having complementary metal-oxide-semiconductor (CMOS) compatibility and as a result of a low cost associated with silicon photonics platforms. However, silicon may not be usable as an absorption medium for the avalanche photodiode. Thus, germanium may be selected as an absorption medium based on germanium being associated with relatively high absorption for telecommunications wavelengths. Moreover, germanium may be selected based on germanium being epitaxially growable on silicon substrates. However, a silicon-germanium based avalanche photodiode may be associated with excess noise as a result of using germanium as the absorption medium. For example, when multiplication inadvertently occurs in germanium layers configured as the absorption medium, a high ionization rate of germanium may result in excess noise, which may limit the multiplication effect in the avalanche photodiode. Furthermore, silicon-germanium based avalanche photodiodes may be associated with relatively high biasing voltage requirements and high transit times.

Some implementations described herein provide a bias control structure for avalanche photodiodes. For example, a waveguide coupled silicon-germanium avalanche photodiode may include a bias control structure separate from an anode and a cathode of the avalanche photodiode. In this case, the bias control structure may be connected to a charge region of the avalanche photodiode and may enable granular control of a first electric field in an absorption region of the avalanche photodiode and of a second electric field in a multiplication region of the avalanche photodiode. This may enable the avalanche photodiode to cause multiplication to occur in a silicon portion of the avalanche photodiode and absorption to occur in a germanium portion of the avalanche photodiode (without multiplication occurring in the intrinsic germanium). In this way, an amount of noise in the avalanche photodiode may be reduced by reducing an amount of multiplication that occurs in germanium relative to other configurations of avalanche photodiodes, such as an avalanche photodiode where an anode and a cathode, alone, generate electric fields in the avalanche photodiode.

Figure 1A:
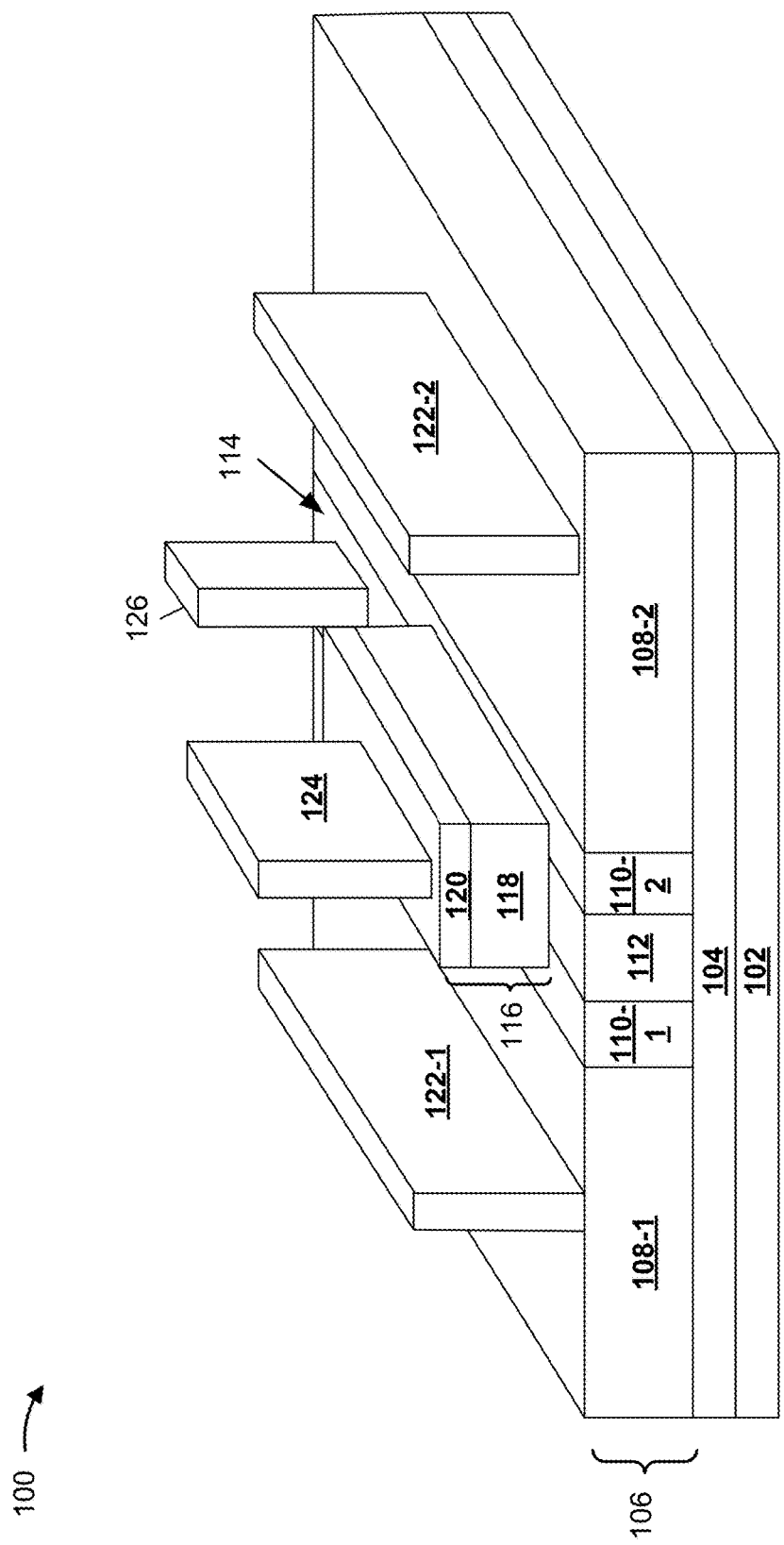
FIGS. 1A and 1B are diagrams of an overview of an example implementation described herein.
Figure 1B:
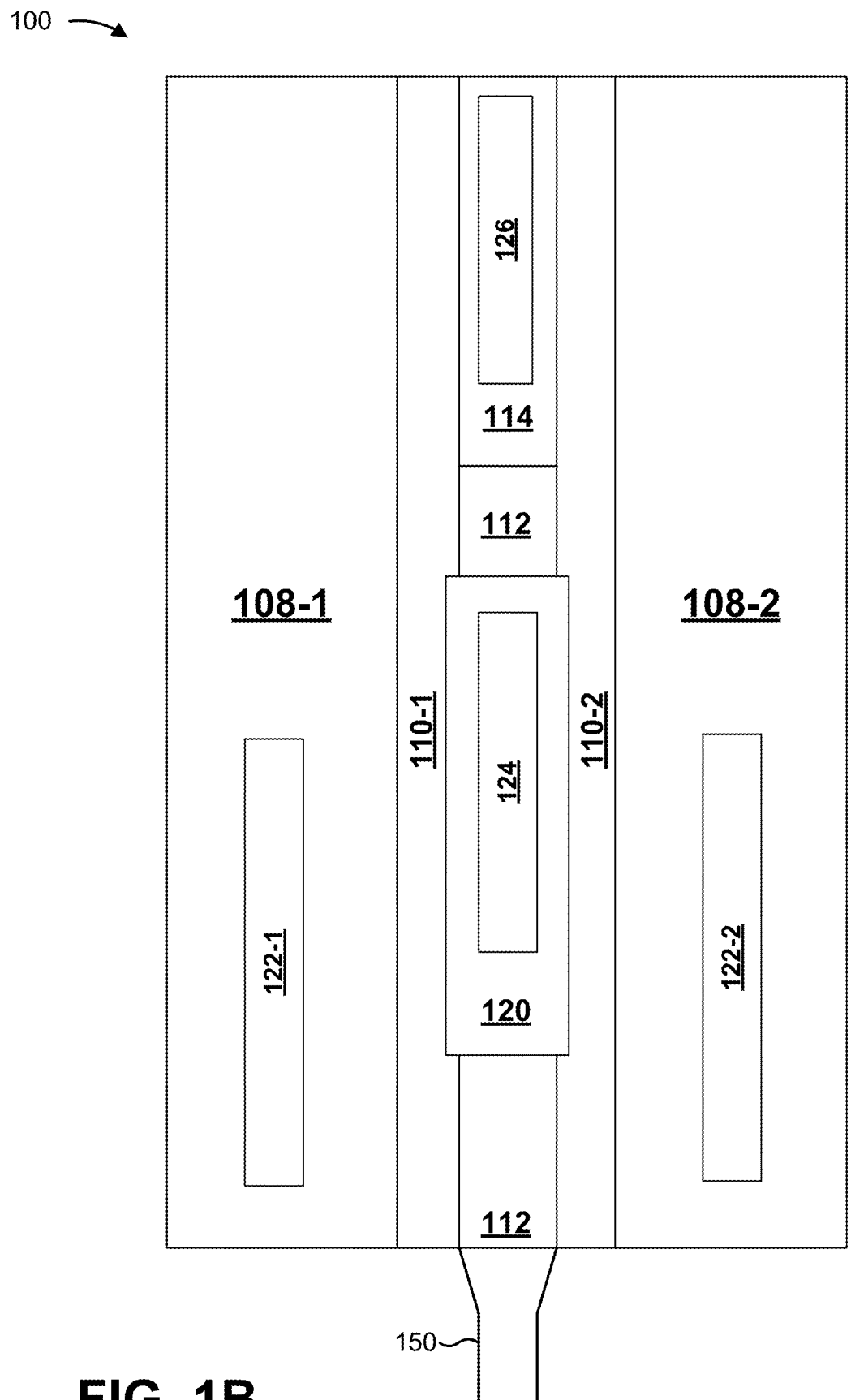

FIGS. 1A and 1B are diagrams of an overview of an example implementation 100 described herein. FIGS. 1A and 1B show an example of an avalanche photodiode with a bias control structure.

In some implementations, the avalanche photodiode may include a substrate 102. For example, substrate 102 may be a silicon substrate onto which one or more layers are deposited, such as one or more silicon layers, germanium layers, and/or the like to form a silicon-germanium avalanche photodiode. In some implementations, substrate 102 and other layers of the avalanche photodiode may form a III-V semiconductor, a complementary metal oxide semiconductor (CMOS) structure, and/or the like. In some implementations, substrate 102 may be an indium-phosphide (InP) substrate, an indium-gallium-arsenide (InGaAs) substrate, and/or the like. In some implementations, the avalanche photodiode may include a buffer layer 104. For example, an InP buffer layer 104, an InGaAs buffer layer 104, a silica buffer layer 104 may be disposed on substrate 102.

In some implementations, the avalanche photodiode may include a silicon layer 106, which includes sections 108 through 112. For example, silicon layer 106 may include a set of n-doped silicon sections 108 (e.g., a first n-doped silicon section 108-1 and a second n-doped silicon section 108-2), a set of intrinsic silicon sections 110 (e.g., a first intrinsic silicon section 110-1 and a second intrinsic silicon section 110-2), a first p-doped silicon section 112, and a second p-doped silicon section 114 disposed onto buffer layer 104.

In some implementations, n-doped silicon sections 108 may sandwich intrinsic silicon sections 110, p-doped silicon sections 112 and/or 114, and/or the like. For example, n-doped silicon sections 108 may be disposed at edges of the avalanche photodiode in silicon layer 106 and may sandwich intrinsic silicon sections 110, which may sandwich first p-doped silicon section 112 and second p-doped silicon section 114. In some implementations, n-doped silicon sections 108 may form ohmic contacts for the avalanche photodiode. For example, n-doped silicon sections 108 may be configured to receive cathodes 122, as described below. In some implementations, intrinsic silicon sections 110 may form a multiplication region for the avalanche photodiode. For example, intrinsic silicon sections 110 and/or first p-doped silicon section 112 may form a gain response layer that is a charge medium. In this case, intrinsic silicon sections 110 and/or first p-doped silicon section 112 may provide a multiplicative gain to a response provided by a photon absorbing layer formed by intrinsic germanium layer 118, as described in more detail herein.

In some implementations, first p-doped silicon section 112 and second p-doped silicon section 114 may be associated with different doping characteristics. For example, first p-doped silicon section 112 may be associated with a lesser amount of doping than second p-doped silicon section 114. In this case, second p-doped silicon section 114 may be heavily doped (i.e., strongly doped or high dosage doped or p++ doped) silicon and first p-doped silicon section 112 may be low to medium doped silicon. In some implementations, second p-doped silicon section 114 may form an ohmic contact for bias control structure 126. For example, bias control structure 126 may be disposed onto second p-doped silicon section 114 to control respective electric fields of the avalanche photodiode in the absorption region and the multiplication region of the avalanche photodiode.

In some implementations, the avalanche photodiode may include a set of germanium layers 116 forming a set of photon absorbing layers. For example, the set of germanium layers 116 may be disposed onto silicon layer 106 (e.g., onto intrinsic silicon sections 110 and first p-doped silicon section 112 of silicon layer 106). In some implementations, the set of germanium layers 116 may be epitaxially grown on silicon layer 106. For example, the set of germanium layers 116 may be epitaxially grown to an epitaxy height of less than 1000 nanometers (nm), 900 nm, 800 nm, and/or the like which may enable a threshold energy field to be formed in the avalanche photodiode. In some implementations, based on the set of germanium layers 116 having a total thickness of less than 1000 nm, the set of germanium layers 116 may ensure less than a threshold transit time for the avalanche photodiode. In some implementations, based on the set of germanium layers 116 having a total thickness of less than 1000 nm, the set of germanium layers 116 ensure less than a threshold bias voltage requirement at anode 124 to operate the avalanche photodiode. For example, when the set of germanium layers 116 are associated with a height of 200 nm, a bias voltage requirement may be approximately 7 volts (V). Additionally, or alternatively, when the set of germanium layers 116 are associated with a height of 400 nm, a bias voltage requirement may be approximately 20 V.

In some implementations, the set of germanium layers 116 may include multiple layers, such as an intrinsic germanium layer 118, a p-doped germanium layer 120, and/or the like. In some implementations, intrinsic germanium layer 118 may form an absorption region of the avalanche photodiode. For example, intrinsic germanium layer 118 may be a photon absorbing layer to absorb photons of an optical beam and provide a response. In some implementations, the set of germanium layers 116 may be another material. For example, the avalanche photodiode may include a different photon absorbing material, such as indium-phosphide, indium-gallium-arsenide, and/or the like. In some implementations, p-doped germanium layer 120 may be strongly p-doped (i.e., heavily doped or high dosage doped—p++ doped). For example, p-doped germanium layer 120 may be strongly p-doped to form an ohmic contact for anode 124. In this case, p-doped germanium layer 120 may be a top portion or surface of the set of germanium layers 116, thereby enabling anode 124 to be disposed onto the set of germanium layers 116. In some implementations, the set of germanium layers 116 may be associated with rectangular cross-sections, and p-doped germanium layer 120 may be disposed onto intrinsic germanium layer 118 to cover intrinsic germanium layer 118.

In some implementations, the avalanche photodiode may include a set of cathodes 122 (e.g., a first cathode 122-1 and a second cathode 122-2) and an anode 124 to generate an electric field for the avalanche photodiode. In some implementations, cathodes 122 and anode 124 may be associated with a rectangular cross-section, as shown. In some implementations, the avalanche photodiode may include a bias control structure 126. For example, the avalanche photodiode may include bias control structure 126 to control respective electric fields in the multiplication region and absorption region, as described in more detail herein. In some implementations, an integrated spiral inductor may be connected to bias control structure 126 and the avalanche photodiode to isolate a radio frequency (RF) signal and a direct current (DC) signal in the avalanche photodiode.

As shown in FIG. 1B, a waveguide 150 may be coupled to a surface of the avalanche photodiode to direct light to the avalanche photodiode for measurement. For example, waveguide 150 may couple to first p-doped silicon section 112 to direct light toward first p-doped silicon section 112. In this case, light is directed through first p-doped silicon section 112 toward intrinsic germanium layer 118, which may be an absorption region of the avalanche photodiode, via evanescent coupling. In some implementations, waveguide 150 may be a silicon waveguide.

As indicated above, FIGS. 1A and 1B are provided merely as one or more examples. Other examples may differ from what is described with regard to FIGS. 1A and 1B.

Figure 2:
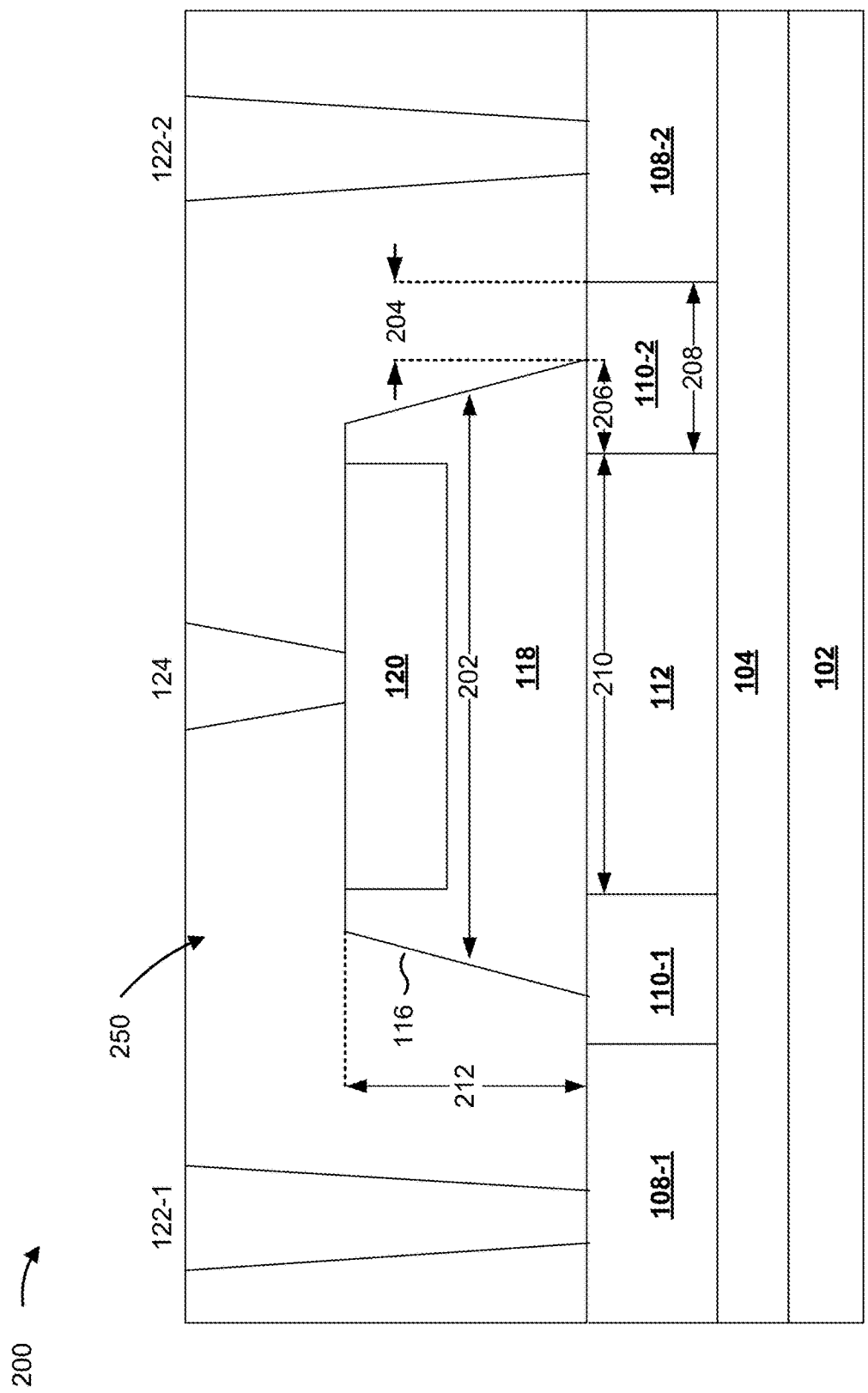
FIG. 2 is a diagram of an example implementation described herein.

FIG. 2 is a diagram of a cross sectional overview of an example implementation 200 described herein. As shown in FIG. 2, cathodes 122, anode 124, and intrinsic germanium layer 118 may be associated with non-rectangular cross-sections as is shown in FIGS. 1A and 1B. For example, cathodes 122 and anodes 124 may be associated with trapezoidal cross-sectional shapes. Additionally, or alternatively, intrinsic germanium layer 118 may be associated with a trapezoidal cross-sectional shape and may include a cavity to receive p-doped germanium layer 120.

As further shown in FIG. 2, intrinsic germanium layer 118 may be associated with a width 202. For example, width 202 may be approximately 1500 nm. In some implementations, width 202 may be between approximately 400 nm and 10000 nm.

As further shown in FIG. 2, an edge of intrinsic germanium layer 118 may be offset from a first edge of an intrinsic silicon section 110 by an offset 204. For example, offset 204 may be approximately 100 nm. In some implementations, offset 204 may be between approximately 0 nm and 1000 nm. In some implementations, a size of offset 204 may be set to control a bias voltage and a multiplication factor of the avalanche photodiode. Similarly, the edge of intrinsic germanium layer 118 may be offset from a second edge of intrinsic silicon section 110 by an offset 206, and intrinsic silicon section 110 may have a width 208. For example, offset 206 may be approximately 100 nm. In some implementations, offset 206 may be between approximately 0 nm and 1000 nm. Additionally, or alternatively, width 208 may be approximately 200 nm. In some implementations, width 208 may be between approximately 0 nm and approximately 2000 nm.

As further shown in FIG. 2, first p-doped silicon section 112 may be associated with a width 210. For example, width 210 may be approximately 1300 nm. In some implementations, width 210 may be smaller than width 202 and greater than widths 204, 206, and 208. In some implementations, a size of width 210 relative to width 202 may be selected to control a gain for a specific value.

As further shown in FIG. 2, the set of germanium layers 116 (e.g., intrinsic germanium layer 118 and p-doped germanium layer 120) may be associated with a height 212. For example, height 212 may be less than approximately 800 nm, such as between approximately 200 nm and 400 nm.

As further shown in FIG. 2, and by reference number 250, a fill material may be disposed onto the avalanche photodiode to fill interstices between, for example, edges of the avalanche photodiode, cathode 122, anode 124, the set of germanium layers 116, and a surface of silicon layer 106. In some implementations, the fill material may be a cladding material or cover material to enclose cathodes 122, anode 124, the set of germanium layers 116, silicon layer 106, and/or the like, thereby improving a durability of the avalanche photodiode. In some implementations, the fill material is silicon dioxide.

As indicated above, FIG. 2 is provided merely as an example. Other examples may differ from what is described with regard to FIG. 2.

Figure 3:
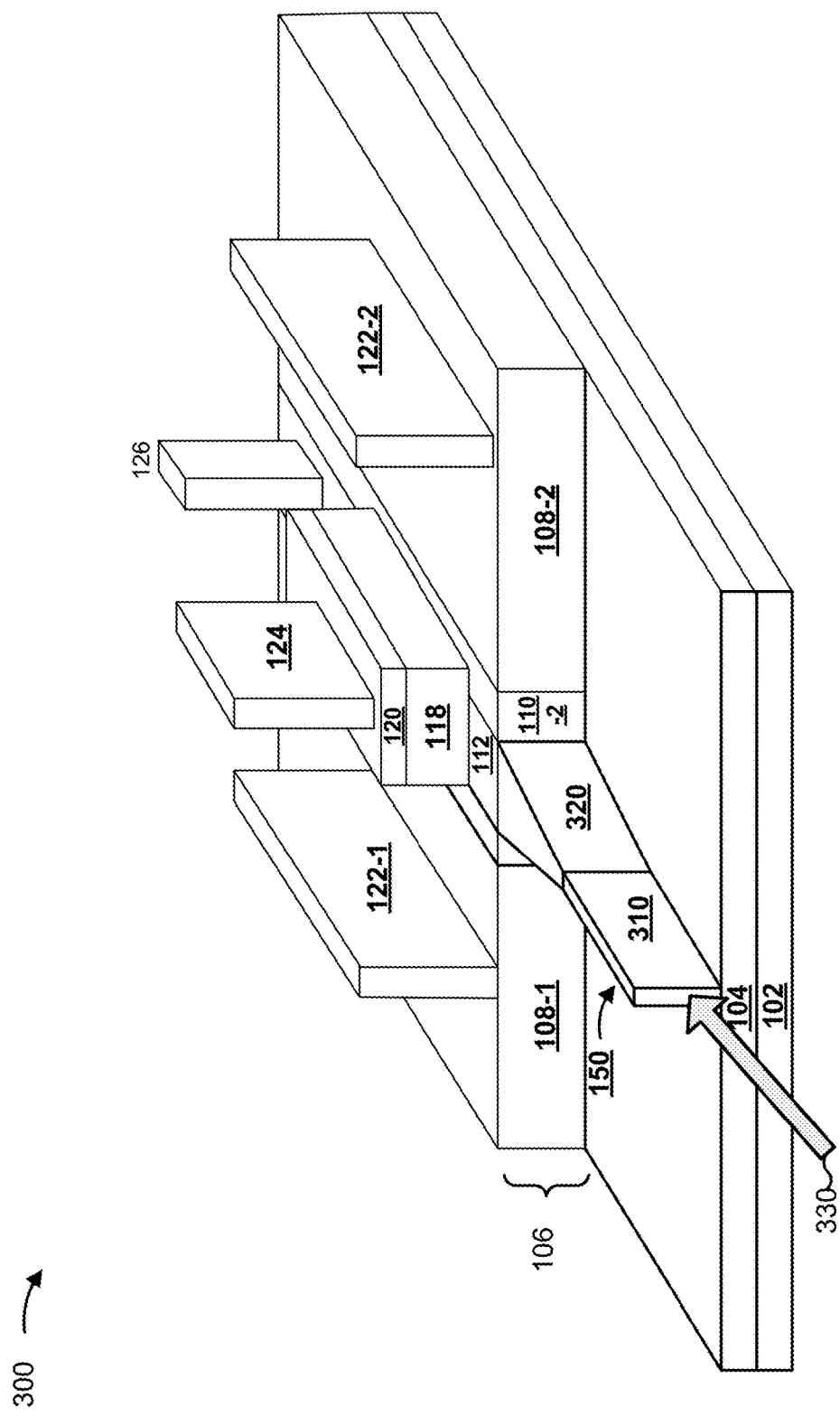
FIG. 3 is a diagram of an example implementation described herein.

FIG. 3 is a diagram of an overview of an example implementation 300 described herein. As shown in FIG. 3, example implementation 300 includes waveguide 150 coupled to the avalanche photodiode. For example, waveguide 150 may be physically coupled to the avalanche photodiode and an optical beam may be optically coupled from the waveguide 150 into first p-doped silicon section 112 of the avalanche photodiode by butt coupling. In some implementations, waveguide 150 may include a rectangular section 310 and a tapered section 320, which may each be disposed onto buffer layer 104 on substrate 102. In some implementations, tapered section 320 may be associated with a width of rectangular section 310 (e.g., which may be a waveguide width) at a first end and a width of first p-doped silicon section 112 at a second end, thereby directing an optical beam 330 into first p-doped silicon section 112. In some implementations, optical beam 330 may be a free space optical beam or may be light from an optical fiber. In some implementations, optical beam 330 may be directed into the avalanche photodiode from an edge-coupled device, a butt-coupled device, a grating-coupled device, and/or the like.

As indicated above, FIG. 3 is provided merely as an example. Other examples may differ from what is described with regard to FIG. 3.

Figure 4:
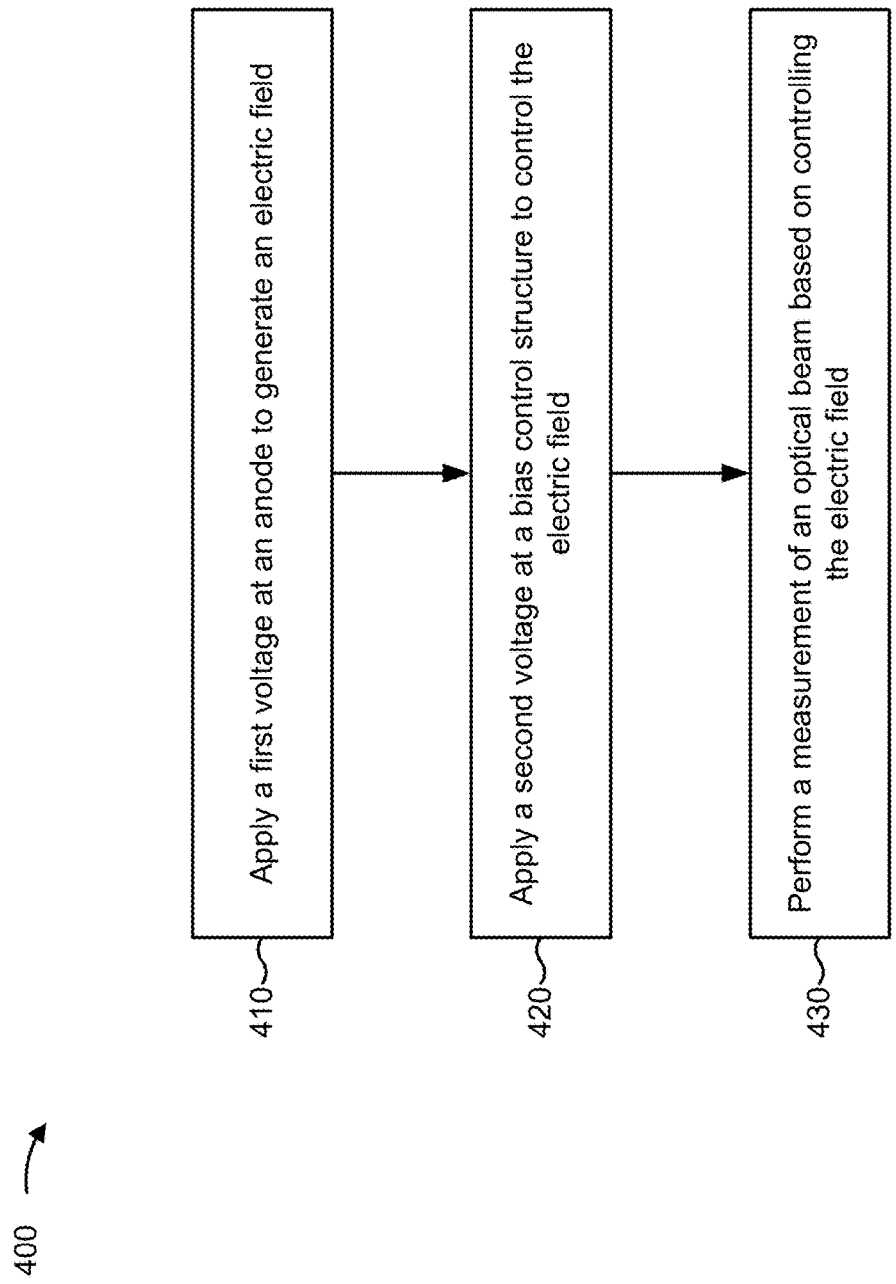
FIG. 4 is a flow chart of an example process for using an avalanche photodiode with a bias control structure.

FIG. 4 is a flow chart of an example process 400 for using an avalanche photodiode that includes a bias control structure. In some implementations, one or more process blocks of FIG. 4 may be performed by an avalanche photodiode. In some implementations, one or more process blocks of FIG. 4 may be performed by another device or a group of devices separate from or including the avalanche photodiode, such as a controller, an optical system that includes a photodiode (e.g., an avalanche photodiode), an optical detector that includes an avalanche photodiode, and/or the like.

As shown in FIG. 4, process 400 may include applying a first voltage at an anode to generate an electric field (block 410). For example, the avalanche photodiode may apply the first voltage at the anode to generate the electric field and to provide a negative voltage to the intrinsic germanium layer. In some implementations, the first voltage may be a negative voltage. For example, a negative bias voltage may be applied at the anode to generate an electric field inside an intrinsic germanium layer of the avalanche photodiode. In this case, the electric field inside the intrinsic germanium may reverse bias the intrinsic germanium, which may cause the intrinsic germanium to collect generated carriers in the avalanche photodiode. In some implementations, a cathode of the avalanche photodiode may be a ground for the anode.

As further shown in FIG. 4, process 400 may include applying a second voltage at a bias control structure to control the electric field (block 420). For example, the avalanche photodiode may apply the second voltage at the bias control structure to control the electric field (e.g., within the intrinsic germanium layer) that is generated by applying the first voltage at the anode. In this case, an amplitude of a gain bias applied at the bias control structure is controllable by the avalanche photodiode and/or a controller thereof to control the electric field in the intrinsic germanium layer and the intrinsic silicon section of the silicon layer. For example, the gain bias is applied to cause a first electric field in the intrinsic germanium layer (e.g., a first portion of the electric field that is within the intrinsic germanium layer) and a second electric field in the intrinsic silicon section of the silicon layer (e.g., a second portion of the electric field that is within the intrinsic silicon section). In some implementations, the amplitude of the gain bias may be less than an amplitude of the anode bias.

In some implementations, a gain value of the avalanche photodiode is optimized based on a width of a charge region of a gain response layer of the avalanche photodiode. In some implementations, the gain value of the avalanche photodiode is optimized based on a width of a photon absorbing layer of the avalanche photodiode. In some implementations, the amplitude of the gain bias may be controlled to control the electric fields (i.e., multiple areas of a single electric field) in the intrinsic silicon section and the intrinsic germanium layer, such that the electric field in the intrinsic silicon layer is stronger than the electric field in the intrinsic germanium layer. In this way, the bias control structure ensures that a reduced amount of multiplication occurs within the intrinsic germanium layer (or another material forming an absorption region), such as less than 50% of multiplication, and that a threshold percentage of multiplication does occur within the intrinsic silicon section (or another material forming a multiplication region), such as greater than 50% of multiplication.

As further shown in FIG. 4, process 400 may include performing a measurement of an optical beam based on controlling the electric field (block 430). For example, the avalanche photodiode may perform a measurement of the optical beam based on controlling the electric field to cause multiplication to occur in the intrinsic silicon section and absorption to occur in the intrinsic germanium layer. In this way, the avalanche photodiode enables optical signal measurement for telecommunications applications (e.g., for an optical communications system or a detector thereof).

Process 400 may include additional implementations, such as any single implementation or any combination of implementations described herein. Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. An avalanche photodiode, comprising:
   a photon absorbing layer to absorb photons of an optical beam and to provide a response;
   a gain response layer to provide a gain to the response; and
   a bias control structure connected to the gain response layer to control an electric field in the photon absorbing layer and the gain response layer.

2. The avalanche photodiode of claim 1, wherein a top portion of the photon absorbing layer is p-doped to form an ohmic contact to receive an anode.

3. The avalanche photodiode of claim 1, wherein a portion of the gain response layer is p-doped to form a charge medium.

4. The avalanche photodiode of claim 1, wherein a gain value of the avalanche photodiode is optimized based on a first width of a charge region of the gain response layer and a second width of the photon absorbing layer.

5. The avalanche photodiode of claim 1, wherein a portion of the gain response layer is n-doped to form an ohmic contact to receive a cathode.

6. The avalanche photodiode of claim 1, wherein a portion of the gain response layer is p-doped to form an ohmic contact to receive the bias control structure.

7. A photodiode, comprising:
   a substrate;
   a buffer layer;
   a silicon layer, comprising:
      a set of p-doped silicon sections, comprising:
         a first p-doped silicon section, and
         a second p-doped silicon section,
      a set of intrinsic silicon sections sandwiching the set of p-doped silicon sections, and
      a set of n-doped silicon sections sandwiching the set of intrinsic silicon sections;
   a set of germanium layers, comprising:
      an intrinsic germanium layer disposed on the set of intrinsic silicon sections and the first p-doped silicon section, and
      a p-doped germanium layer disposed on the intrinsic germanium layer;
   a set of cathodes disposed on the set of n-doped silicon sections;
   an anode disposed on the p-doped germanium layer; and
   a bias control structure disposed on the second p-doped silicon section.

8. The photodiode of claim 7, wherein the set of germanium layers is epitaxially grown on the silicon layer.

9. The photodiode of claim 7, wherein a total thickness of the set of germanium layers is less than 800 nanometers (nm).

10. The photodiode of claim 7, further comprising:
a spiral inductor connected to the bias control structure to isolate a radio frequency signal and a direct current signal.

11. The photodiode of claim 7, further comprising:
a silicon waveguide coupled to the first p-doped silicon section.

12. The photodiode of claim 7, wherein the anode is to provide a first negative voltage to the intrinsic germanium layer and the bias control structure is to apply a second negative voltage to control an electric field in the intrinsic germanium layer.

13. The photodiode of claim 7, wherein the anode, the set of cathodes, and the bias control structure are to induce a first electric field in the intrinsic germanium layer and a second electric field in the set of intrinsic silicon sections.

14. The photodiode of claim 13, wherein the second electric field is greater than the first electric field.

15. The photodiode of claim 7, further comprising:
a cladding material to enclose the set of cathodes, the anode, the set of germanium layers, and the silicon layer.

16. An optical detector, comprising:
an avalanche photodiode, comprising:
a first layer to absorb photons of an optical beam and to provide a response;
a second layer to provide a gain to the response; and
a bias control structure connected to the first layer to control a first electric field in the first layer and a second electrical field in the second layer; and
a waveguide coupled to the avalanche photodiode to direct the optical beam to the second layer.

17. The optical detector of claim 16, further comprising an anode and a cathode separate from the bias control structure.

18. The optical detector of claim 16, wherein the first layer is germanium and the second layer is silicon.

19. The optical detector of claim 16, wherein the optical detector is a III-V semiconductor optical detector.

20. The optical detector of claim 16, wherein the avalanche photodiode further comprises:
a substrate,
wherein the substrate is indium-gallium-arsenide (InGaAs) or indium phosphide (InP).

* * * * *